(12) United States Patent
Solihin

(10) Patent No.: US 9,990,293 B2
(45) Date of Patent: Jun. 5, 2018

(54) ENERGY-EFFICIENT DYNAMIC DRAM CACHE SIZING VIA SELECTIVE REFRESH OF A CACHE IN A DRAM

(71) Applicant: EMPIRE TECHNOLOGY DEVELOPMENT LLC, Wilmington, DE (US)

(72) Inventor: Yan Solihin, Raleigh, NC (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 238 days.

(21) Appl. No.: 14/457,128

(22) Filed: Aug. 12, 2014

(65) Prior Publication Data
US 2016/0048451 A1    Feb. 18, 2016

(51) Int. Cl.
| | | |
|---|---|---|
| *G06F 12/08* | (2016.01) | |
| *G06F 12/12* | (2016.01) | |
| *G11C 7/10* | (2006.01) | |
| *G06F 12/0831* | (2016.01) | |
| *G06F 12/0811* | (2016.01) | |
| *G11C 11/401* | (2006.01) | |
| *G11C 11/406* | (2006.01) | |
| *G06F 12/123* | (2016.01) | |

(52) U.S. Cl.
CPC ...... *G06F 12/0833* (2013.01); *G06F 12/0811* (2013.01); *G11C 7/1072* (2013.01); *G11C 11/40607* (2013.01); *G11C 11/40622* (2013.01); *G06F 12/123* (2013.01); *G06F 2212/1024* (2013.01); *G11C 11/401* (2013.01); *G11C 11/406* (2013.01); *Y02D 10/13* (2018.01)

(58) Field of Classification Search
CPC .......................... G11C 11/401; G11C 11/406
See application file for complete search history.

(56) References Cited

U.S. PATENT DOCUMENTS

| | | | |
|---|---|---|---|
| 4,380,812 A | 4/1983 | Ziegler, II et al. | |
| 5,122,988 A | 6/1992 | Graeve | |
| 6,282,147 B1 * | 8/2001 | Fujima | G11C 8/12 365/230.06 |
| 6,920,523 B2 | 7/2005 | Le et al. | |
| 6,990,029 B2 | 1/2006 | Hardee | |
| 7,421,552 B2 * | 9/2008 | Long | G06F 11/1441 711/103 |

(Continued)

OTHER PUBLICATIONS

Shekhar Borkar et al., "The Future of Microprocessors", Communications of the ACM, May 2011, pp. 67-77, vol. 54, No. 5.

(Continued)

*Primary Examiner* — Charles Rones
*Assistant Examiner* — Tian-Pong Chang

(57) ABSTRACT

Techniques described herein generally include methods and systems related to improving energy efficiency in a chip multiprocessor by reducing the energy consumption of a DRAM cache for such a multi-chip processor. Methods of varying refresh interval may be used to improve the energy efficiency of such a DRAM cache. Specifically, a per-set refresh interval based on retention time of memory blocks in the set may be determined, and, starting from the leakiest memory block, memory blocks stored in the DRAM cache that are associated with data also stored in a lower level of cache are not refreshed.

24 Claims, 9 Drawing Sheets

(56) References Cited

U.S. PATENT DOCUMENTS

| | | | |
|---|---|---|---|
| 7,805,658 B2 | 9/2010 | Luk et al. | |
| 8,443,230 B1* | 5/2013 | James-Roxby | G06F 11/1641 714/11 |
| 2004/0062119 A1* | 4/2004 | Stimak | G06F 13/1689 365/222 |
| 2006/0002220 A1 | 1/2006 | Spengler | |
| 2009/0144491 A1 | 6/2009 | Faucher et al. | |
| 2009/0259813 A1* | 10/2009 | Yasufuku | G06F 12/0811 711/122 |
| 2011/0022801 A1* | 1/2011 | Flynn | G06F 9/52 711/120 |
| 2012/0054441 A1* | 3/2012 | Nakashima | G06F 11/1441 711/124 |
| 2012/0159074 A1 | 6/2012 | Sodhi et al. | |
| 2012/0198163 A1* | 8/2012 | Damodaran | H03K 19/0016 711/122 |
| 2012/0278548 A1 | 11/2012 | Bronson et al. | |
| 2013/0111121 A1 | 5/2013 | Knanthakrishnan et al. | |
| 2014/0013132 A1* | 1/2014 | de Rochemont | G06F 1/3203 713/320 |

OTHER PUBLICATIONS

Philip G. Emma et al., "Rethinking Refresh: Increasing Availability and Reducing Power in DRAM for Cache Applications", IEEE Micro, 2008, pp. 47-56, vol. 28, Issue 6, IEEE Computer Society.
Denis Foley et al., "AMD's "Llano" Fusion APU", Hot Chips 23, Aug. 19, 2011, pp. 1-38.
Mrinmoy Ghosh et al., "DRAM Decay: Using Decay Counters to Reduce Energy Consumption in DRAMs", In Proceedings of the 3rd Watson Conference on Interaction between Architecture, Circuits, and Compilers (P=AC2), Oct. 2006, Yorktown Heights, NY.
Mrinmoy Ghosh et al., "Smart Refresh: An Enhanced Memory Controller Design for Reducing Energy in Conventional and 3D Die-Stacked DRAMs", In Proceedings of the 40th International Symposium on Microarchitecture, 2007, pp. 134-145, IEEE Computer Society.
Maziar Goudarzi et al., "A Software Technique to Improve Yield of Processor Chips in Presence of Ultra-Leaky SRAM Cells Caused by Process Variation", IEEE, 2007, pp. 878-883.
Intel Corporation, "Intel® CoreTM2 Duo Mobile Processor, Intel® CoreTM2 Solo Mobile Processor and Intel® CoreTM2 Extreme Mobile Processor on 45-nm Process", for platforms based on Mobile Intel® 4 Series Express Chipset Family, Datasheet, Mar. 2009, pp. 1-113.
Nam Sung Kim et al., "Circuit and Microarchitectural Techniques for Reducing Cache Leakage Power", IEEE Transactions on Very Large Scale Integration (VLSI) Systems, Sep. 27, 2003, pp. 1-29, vol. 12, Issue 2.
Kinam Kim et al., "A New Investigation of Data Retention Time in Truly Nanoscaled DRAMs", IEEE Electron Device Letters, Aug. 2009, pp. 846-848, vol. 30, No. 8.
Jamie Liu et al., "RAIDR: Retention-Aware Intelligent DRAM Refresh", Proceedings of the 39th International Symposium on Computer Architecture (ISCA), Jun. 2012, vol. 40, Issue 3, pp. 1-12.
Chris Wilkerson et al., "Reducing Cache Power with Low-Cost, Multi-bit Error-Correcting Codes," ISCA '10 Proceedings of the 37th annual international symposium on Computer architecture, Jun. 19-23, 2010, pp. 83-93, vol. 38, Issue 3.
Bo Zhao et al., "Process Variation-Aware Nonuniform Cache Management in a 3D Die-Stacked Multicore Processor", IEEE Transactions on Computers, Nov. 2013, pp. 2252-2265 , vol. 62, No. 11.
Bo Zhao et al., "Variation-Tolerant Non-Uniform 3D Cache Management in Die Stacked Multicore Processor", Proceedings of the 42nd Annual IEEE/ACM International Symposium on Microarchitecture, Dec. 12-16, 2009, pp. 222-231, New York, NY.
International Search Report and Written Opinion of the International Searching Authority, International application No. PCT/US2014/032285, dated Aug. 28, 2014.

* cited by examiner

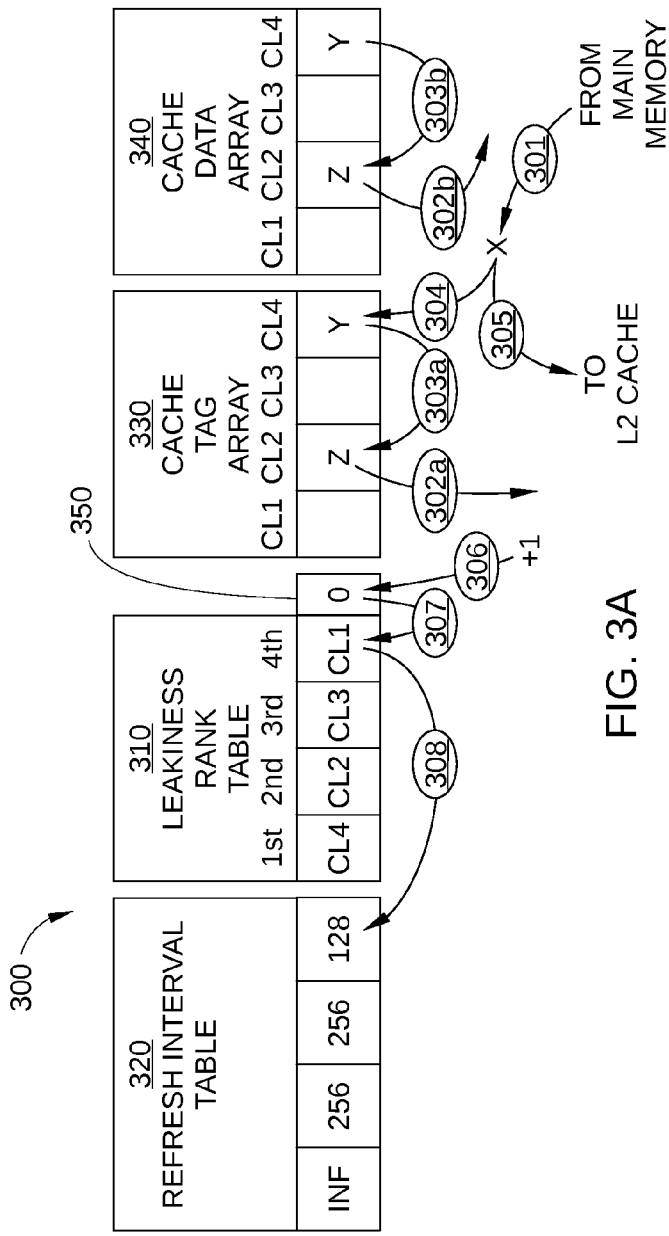
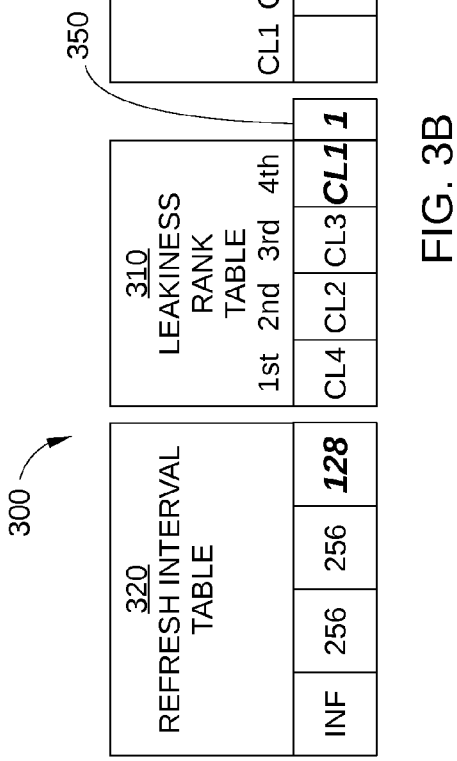
FIG. 3A
FIG. 3B

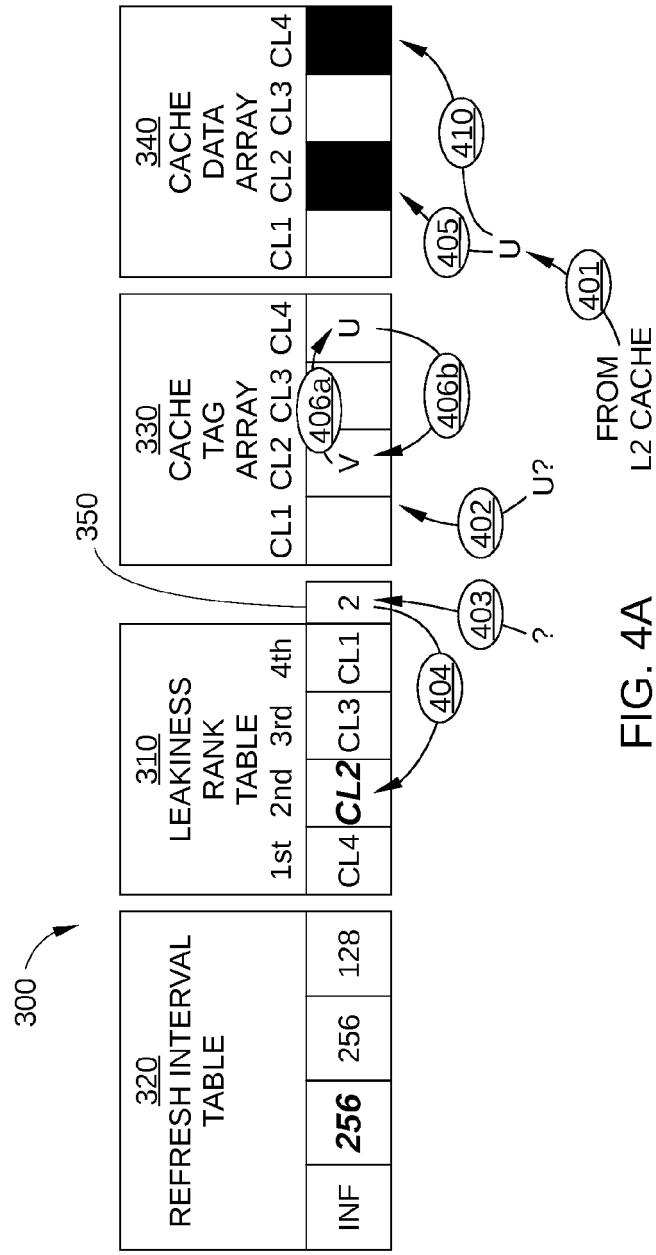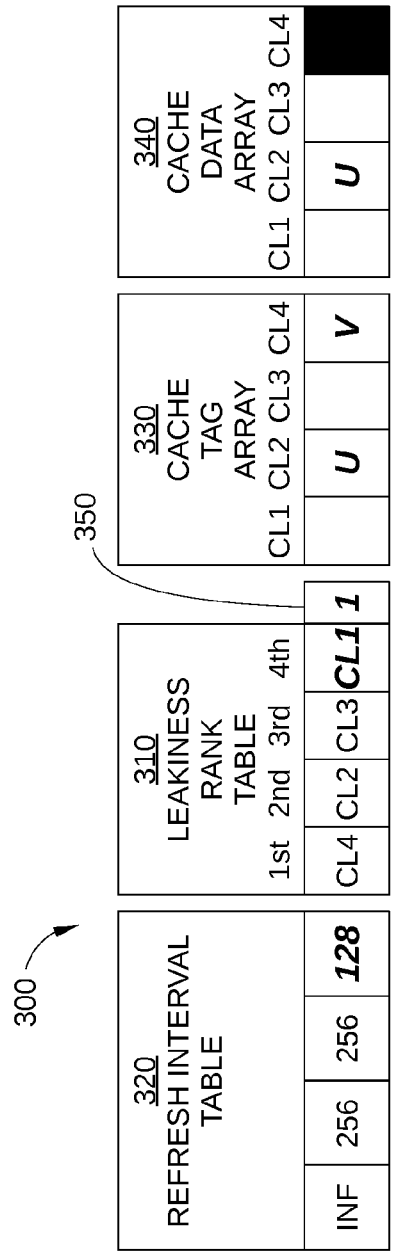
FIG. 4A
FIG. 4B

US 9,990,293 B2

1

ENERGY-EFFICIENT DYNAMIC DRAM CACHE SIZING VIA SELECTIVE REFRESH OF A CACHE IN A DRAM

BACKGROUND

Unless otherwise indicated herein, the approaches described in this section are not prior art to the claims in this application and are not admitted to be prior art by inclusion in this section.

There is a trend toward large-scale chip multiprocessors that include a relatively large number of processor cores, with core counts as high as hundreds or thousands envisioned in the near future. Such processors can greatly reduce processing time for applications that have high levels of concurrency, e.g., applications in which multiple computations can be executed simultaneously or in parallel with each other. However, as this trend continues, efficient use of all processor cores in high core-count chip multiprocessors may become more difficult, since threshold voltages may not be able to be scaled down without exponentially increasing the static power consumption incurred due to leakage current in the chip multiprocessor. As a result, the power budget available per core in high core-count chip multiprocessors may decrease in each future technology generation. This situation may result in a phenomenon referred to as the "power wall," "utility wall," or "dark silicon," where an increasing fraction of a high core-count chip multiprocessor may not be powered at full frequency or powered on at all. Thus, performance improvements in such chip multiprocessors may be strongly contingent on energy efficiency, e.g., performance/watt or operations/joule.

Higher capacity on-chip cache has also been explored as a way to improve chip performance. For example, the last level cache on a multicore die may be implemented in dynamic random access memory (DRAM) rather than static random access memory (SRAM). DRAM may be six to eight times denser than SRAM, and therefore can have significantly greater capacity than a similarly sized SRAM array. This may be particularly advantageous in server chips, in which 50% or more of the die area can be dedicated to on-chip cache. Furthermore, three-dimensional stacking of DRAM chips in a processor chip package may allow one or more separate DRAM dies to be stacked on a logic processor die, thereby facilitating a very large DRAM storage near the processor. Another technology that may achieve high capacity for on-chip cache includes MRAM (magneto-resistive RAM). DRAM is a volatile memory, while in some cases MRAM may be designed to be semi-volatile in order to lower write latency and energy.

SUMMARY

In accordance with at least some embodiments of the present disclosure, a method to cache a data block for a processor comprises loading a first copy of the data block in a first cache that includes a first volatile memory device, loading a second copy of the data block in a second cache that includes a second volatile memory device configured to lose data if not refreshed, selecting a portion of the second cache, the selected portion of the second cache including the second copy of the data block, and, concurrent with or after loading the first copy of the data block, allowing the selected portion of the second cache to discharge over time so that no data is stored in the selected portion after discharge.

In accordance with at least some embodiments of the present disclosure, a method to select a refresh interval for a cache set of a volatile memory device that loses data when not refreshed and is configured as a cache for a processor comprises, for each cache line in the cache set of the volatile memory device, determining a refresh interval that enables the cache line to retain data loaded therein, determining a number of cache lines in the cache set that can remain unrefreshed without a loss of data cached for the processor, selecting cache lines from the cache set that is equal to or less than the determined number of cache lines that can remain unrefreshed without the loss of data cached for the processor, the selected cache lines having a shorter refresh interval than cache lines that are not selected from the set, and allowing the selected cache lines to remain unrefreshed until no data are stored therein.

In accordance with at least some embodiments of the present disclosure, a processor includes circuitry configured to load a first copy of the data block in a first cache that includes a first volatile memory device, load a second copy of the data block in a second cache that includes a second volatile memory device, which loses data if not refreshed, select a portion of the second cache, the selected portion of the second cache including the second copy of the data block, and, concurrent with or after loading the first copy of the data block, allow the selected portion of the second cache to discharge over time so that no data is stored in the selected portion after discharge.

In accordance with at least some embodiments of the present disclosure, a method is described to store a data block in a cache set of a volatile memory device that loses data when not refreshed and is configured as a cache for a processor. The method comprises requesting a first data block that is not stored in the cache, fetching the first data block from a main memory associated with the processor, and storing one of a second data block that is already stored in the cache set or the first data block in a first portion of the cache set, wherein the first portion has a retention time that is equal to or greater than a refresh interval of the cache set at the time the data block is fetched from the main memory.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

FIG. 3A illustrates an example of a cache organization for a particular cache set of a DRAM cache, in accordance with at least some embodiments of the present disclosure;

FIG. 3B illustrates the outcome of an operational example in the cache organization illustrated in FIG. 3A;

FIGS. 4A and 4B illustrate a process with respect to the cache organization illustrated in FIGS. 3A and 3B and the four-way associative cache set associated therewith, according to at least some embodiments of the present disclosure;

DETAILED DESCRIPTION

Figure 1:
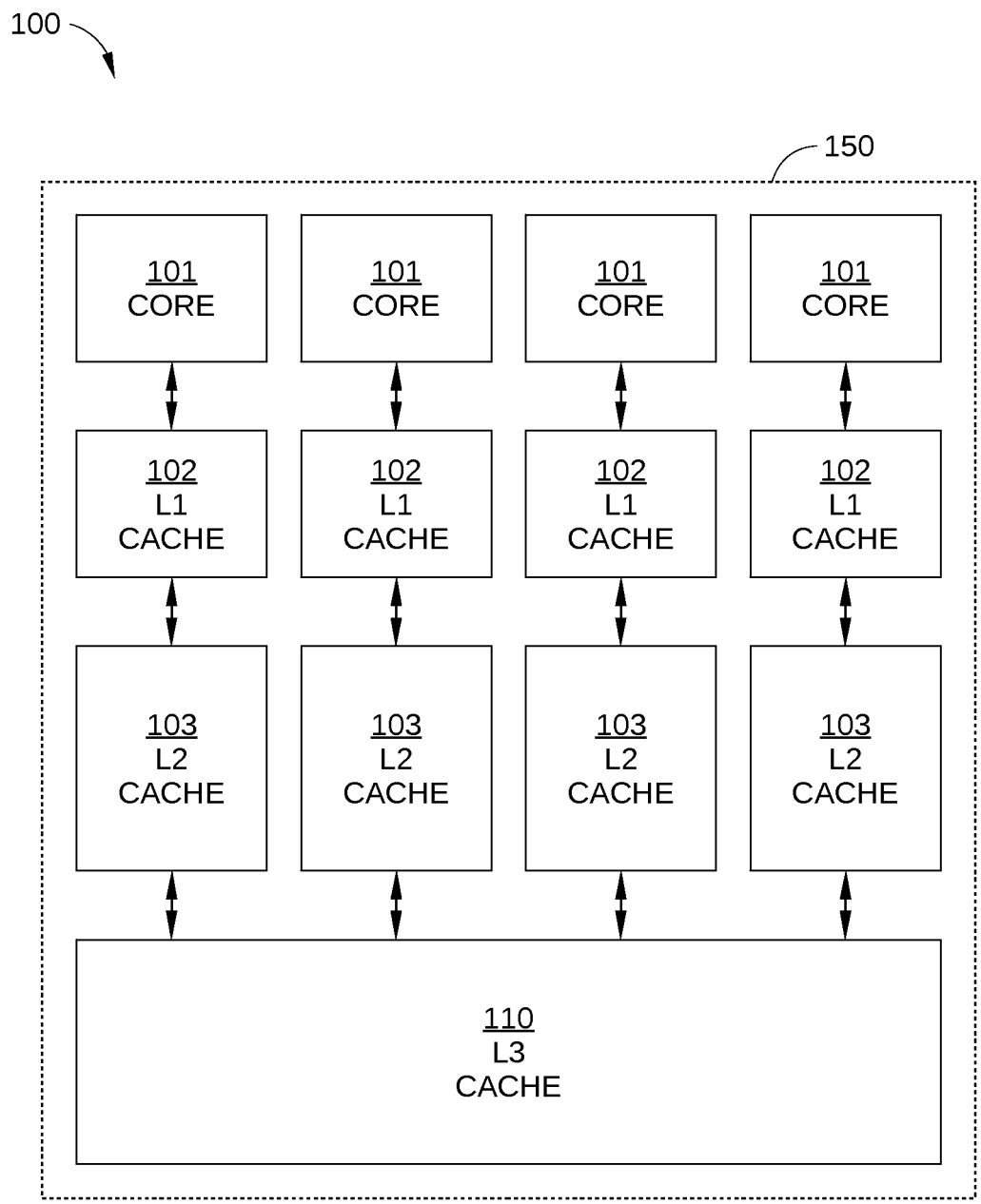
FIG. 1 illustrates an example multicore architecture that may utilize DRAM as a last level cache.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and made part of this disclosure.

This disclosure is generally drawn, inter alia, to methods, apparatus, systems, devices, and computer program products related to reducing refresh energy in a storage device, such as a DRAM.

As described above, one technique for enhancing processor performance is to employ a large number of processor cores in a single processor chip, or die. Performance may be further improved by implementing the last level cache on such a chip in high-density dynamic random access memory (DRAM), rather than in static random access memory (SRAM), since larger on-chip cache may generally translate into reduced latency. However, employing large-capacity DRAM as on-chip cache can exacerbate the "power wall" effect in a host chip as DRAM scales. Specifically, the greater energy demands of a large-capacity DRAM cache can significantly reduce the energy budget available for powering some or all of the processor cores.

A significant portion of the energy consumption of a DRAM device may be due to the refresh energy used during operation. Unlike an SRAM cell, a DRAM cell includes a capacitor that is either charged (e.g., representing a bit value of "1") or not charged (e.g., representing a bit value of "0"). The charge leaks over time, and is refreshed periodically at a particular refresh interval, for example once every 64 ms, by reading out a row of DRAM cells and then restoring each charge in the row of DRAM cells. To prevent the loss of data in a particular DRAM row, the refresh interval may be selected to be equal to or less than a "retention time" for the leakiest DRAM cell in the DRAM row, where the retention time may be the time period in which the DRAM cell retains sufficient charge without losing data.

In a discrete DRAM device used in main memory, refresh power may make up a relatively small portion of the total power consumed by the DRAM device. For example, in a 2 giga-byte (GB) generation DRAM device, refresh power may be on the order of about 10% of total power consumed. But for future generations of DRAM, the transistor miniaturization used to achieve such memory density may generally also involve an increase in manufacturing variation, due to the increased variability associated with manufacturing such small transistors uniformly. Consequently, the refresh interval of the DRAM device may be reduced accordingly to accommodate the threshold voltage of the leakiest DRAM cell, greatly increasing how much refresh power may be consumed by a DRAM device. For example, it is estimated that refresh power for a 64 GB generation DRAM device may be on the order of 45% or more of the total power consumed by such a device. Furthermore, DRAM implemented as on-chip cache may operate at a higher temperature, and hence may be significantly leakier than discrete DRAM devices used for the main memory. Thus, refresh interval of DRAM implemented as on-chip cache may involve an even shorter refresh interval, so that refresh energy may consume a much larger fraction of total power consumption compared to discrete DRAM devices.

Refresh interval may refer to the time between consecutive refreshes of a DRAM device. Generally, the refresh interval may be chosen to be smaller than the retention time, thereby ensuring that DRAM cells are refreshed before losing charge. However, manufacturing variation may cause different DRAM cells to have widely differing retention time, as affected by the variation of threshold voltage of each cell. As a result, in practice and as noted above, the refresh interval may be chosen to be the same as the retention time of the leakiest DRAM cell. The leakiest cell may be inferred statistically, derived from the retention time distribution, e.g. the mean of the distribution minus six times the standard deviation of the distribution, thereby at least substantially ensuring that it is exceedingly rare that any DRAM cells do not work reliably. Such an approach may improve yield and make substantially all DRAM dies operable.

In light of the above, a possible avenue in improving energy efficiency in a chip multiprocessor is to reduce the energy consumption associated with a DRAM cache for such a chip multiprocessor. According to embodiments of the present disclosure, systems and methods of varying refresh interval may be used to improve the energy efficiency of a DRAM device when used as a higher-level cache for the multiprocessor. Specifically, a per-set refresh interval based on retention time of memory blocks in the set may be determined, and, starting from the leakiest memory block, memory blocks in L3 cache storing data that are also stored in the L2 cache are not refreshed. Compared to a DRAM L3 cache that uses a single refresh interval, this approach may increase the refresh interval by as much as 17×, for example, thereby reducing refresh energy by approximately 95%, for example.

FIG. 1 illustrates an example multicore architecture 100 that may utilize DRAM as the last level cache, such as an L3 cache 110. Multicore architecture 100 may include four cores 101 on a die 150, each core having a 32 KB write-through private L1 instruction and data cache 102 and a private 256 KB write-back L2 cache 103, as examples. L3 cache 110 may be shared by all cores 101, and may serve as the last level cache for L2 caches 103. It is noted that while L3 cache 110 may have a size of 8 MB in some implementations, L3 cache 110 may have a capacity that is much larger if implemented with embedded DRAM technology, for example between 32 MB to 64 MB in size. With such a large L3 cache 110, refresh energy may be a significant component of L3 cache 110 energy consumption.

According to some embodiments of the disclosure, such DRAM refresh energy may be significantly reduced by avoiding refresh of some types of memory blocks in L3 cache 110 (e.g., memory blocks storing invalid data or data blocks that are also stored in L2 cache), arranging the memory blocks that are not refreshed to correspond to the leakiest memory blocks, and, when appropriate, increasing the per-set refresh interval of one or more cache sets in L3 cache 110.

L3 cache 110 may be the last level cache on die 150, and may be configured to filter internal requests from having to go off die 150 to the main memory (RAM) or another die. L3 cache may also be a level of cache in which external requests from other chips may be snooped (a process wherein an individual cache monitors address lines for accesses to memory locations). Due to this consideration, typically L3 cache 110 may be inclusive, such that that all blocks that are cached in an L2 cache 103 are also cached in L3 cache 110.

A feature of an inclusive cache is that an external request to a data block may be checked against L3 cache 110. If the data block requested does not exist in L3 cache 110, then the inclusion property thereof indicates that the data block may also not exist in L2 cache 102 or L1 cache 101 for a particular core 101. Most external requests may be generally snooped for correctness by a controller of L3 cache 110, but most of such requests may not concern data blocks that are kept in L3 cache 110 of die 150. Thus, most snoops may stop at L3 cache 110 when an inclusive L3 cache. In comparison, if L3 cache 110 is exclusive or non-inclusive, each snoop may generally be checked against the L3, L2, and perhaps the L1 caches. This not only may waste power and increase contention in the L2 and L1 cache tag arrays, but the snoop may not be responded to until all caches are checked. Such additional delay may significantly increase L3 cache 110 miss latency.

A consequence of an inclusive L3 cache may be wasted capacity, since L3 cache 110 may keep data blocks that may be also in one of L2 caches 103. If the capacity of L2 cache 103 and L3 cache 110 are X and Y, respectively, the total blocks that can be kept uniquely by L3 cache 110 with an inclusive policy may be Y−X, with an exclusive policy may be Y, and with a non-inclusive policy may be anywhere between Y and Y−X. The consequence may be severe if L2 cache 103 is large in comparison to L3 cache 110; for example, in an implementation where there are four 512 KB L2 caches sharing one 2 MB L3 cache. The consequence may be minor if the L2 cache is small in comparison to L3 cache 110. For example, in an implementation where there are four 256 KB L2 caches sharing one 8 MB L3 cache, the space overhead may be 4*256/8192=12.5%, which may be more tolerable. Furthermore, with a DRAM last level cache, L3 cache 110 capacity may be significantly higher compared to an SRAM L3 cache, hence the consequence of an inclusive policy in wasted cache capacity may diminish. Thus, in some embodiments, DRAM last level caches (such as L3 cache 110) may use an inclusive policy. With an inclusive policy, all data blocks in L2 cache 103 are necessarily cached in L3 cache 110 as well. This presents a possible power saving opportunity: refreshing data blocks in L3 cache 110 that are also kept in L2 cache 103 can be avoided, since such data blocks are not needed in L3 cache 110 by a core 101. Core 101 can obtain the data block by accessing L2 cache 103 instead of from L3 cache 110. If there are external read requests for the block from another die, L3 cache 110 can retrieve the data block relatively cheaply or otherwise efficiently and quickly from L2 cache 103, since this may be much cheaper in latency than retrieving the data block from off-die memory. Thus, in the relatively rare occurrence of external data read requests, L3 cache 110 can still supply the data block after the relatively small delay associated with retrieving the data block from L2 cache 103. Therefore, not keeping valid values for blocks in L3 cache that are also kept in the L2 cache may not produce significant overhead, while at the same time reducing the refresh energy.

Figure 2A:
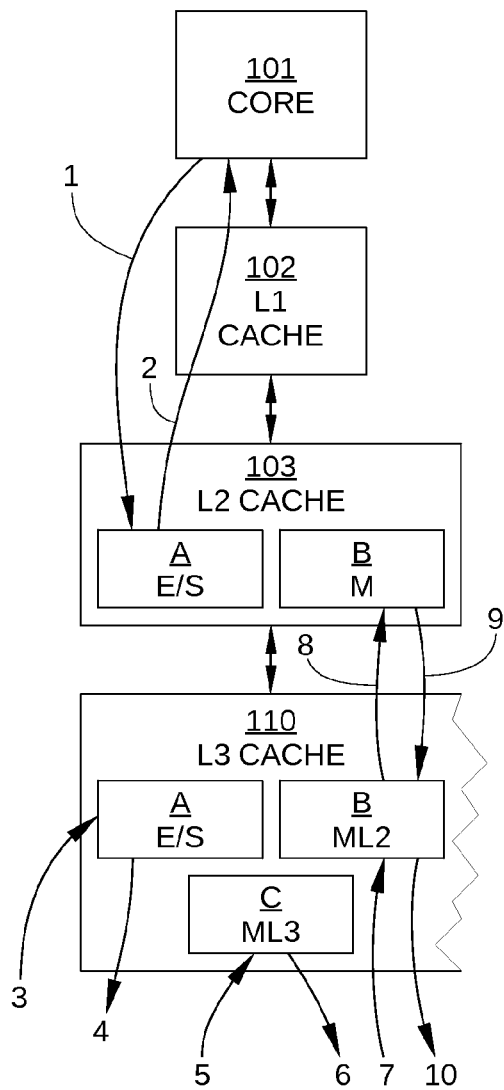
FIGS. 2A and 2B each illustrate a single core, an L1 cache, an L2 cache, and an L3 cache of the multicore architecture of FIG. 1.
Figure 2B:
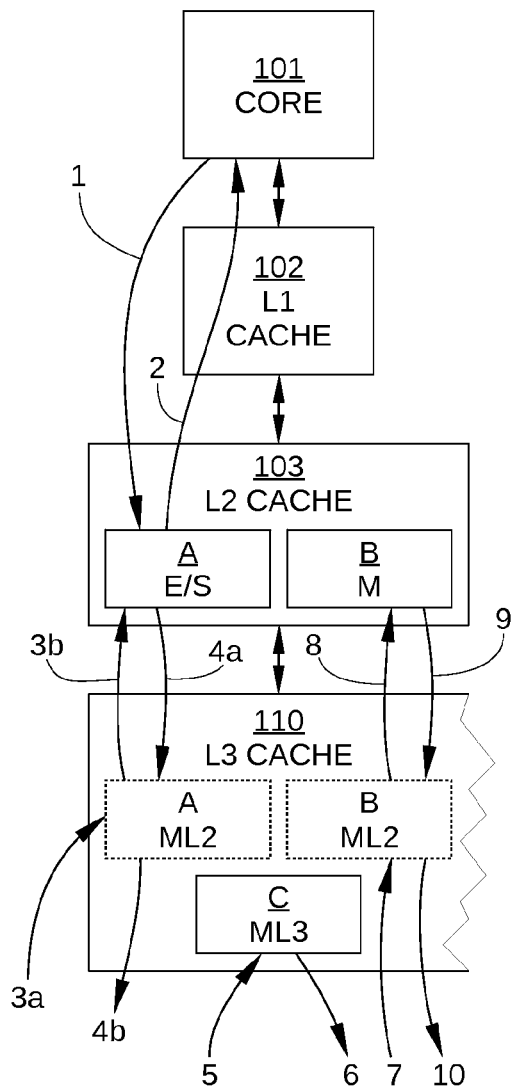

To illustrate the impact of not refreshing certain blocks in L3 cache 110, several example cache scenarios are now described in conjunction with FIGS. 2A and 2B. FIGS. 2A and 2B each illustrate a single core 101, L1 cache 102, L2 cache 103 and L3 cache 110 of the multicore architecture 100 in FIG. 1. In addition, FIG. 2A show the operations of a certain cache policy in response to various events, and FIG. 2B shows the operations of a cache policy according to embodiments of the disclosure in response to these same events.

In both FIGS. 2A and 2B, there may be three data blocks (blocks A, B, and C) currently cached in L3 cache 110. Block A is a "clean" data block, whose value may be the same as a data block in main memory and has an exclusive (E) or shared (S) state. Block A may be loaded or stored in both L3 cache 110 and L2 cache 103. Block B and block C may be "dirty" blocks, whose respective values may have each been modified and therefore may be different than a corresponding data block in main memory. The up-to-date value of block B may be in L2 cache 103 but not in L3 cache 110, hence the state of block B in L3 cache 110 indicates the status "ML2," or modified in L2 cache 103. In comparison, block C may be a dirty block but not kept in L2 cache 103, and hence the up-to-date value of block C may be in L3 cache 110. The state of block C indicates the status "ML3," or modified in L3 cache 110.

In one example scenario, a read request may occur from core 101 for block A (operation 1). Since block A can be found in L2 cache 103, the read request may experience a cache hit and data may be returned to core 101 from L2 cache 103 (operation 2). In another example scenario, an external read request may be made to block A by another processor core, either on-die or off-die (operation 3). Since the block value may be valid in L3 cache 110, data can be supplied by L3 cache 110 (operation 4) to the requesting core (off-die). In another example scenario, a read request may be received for a dirty block C (operation 5). The state of block C is ML3, in which L3 cache 110 may have the valid/up-to-date value of block C, and hence can supply the block (operation 6). In another example scenario, an external read request for block B may be received (operation 7). Since L3 cache 110 may not have the valid value of block B, L3 cache 110 may request L2 cache 103 to write back block B (operation 8). L2 cache 103 may write back block B in response (operation 9), and L3 cache 110 may then supply block B to the requester (operation 10).

FIG. 2B illustrates an example of the impact of a cache policy in which certain memory blocks in L3 cache 110 are not refreshed. In this case, blocks A and B may not be refreshed since block A and block B are kept in L2 cache 103 (due to the inclusive property of L3 cache 110). While blocks A and B may not be refreshed, valid tag and state information for blocks A and B may be refreshed. The state information associated with blocks A and B in L3 cache 110 may indicate that the first copy of the data block is loaded in the L2 cache 103. Thus, only data associated with blocks A and B may not be refreshed and allowed to discharge. The performance impact of not refreshing the portion of L3 cache 110 corresponding to blocks A and B may be small. First, all requests to both block A and block B by core 101 may still hit in L2 cache 103, and hence may not suffer from any performance penalty (operations 1 and 2 for block A in FIG. 2B may be unchanged compared to operations 1 and 2 in FIG. 2A). Second, any external requests to blocks that are in L3 cache 110 but not in L2 cache 103 may be unaffected (operations 5 and 6 in FIG. 2B may be unchanged compared to operations 5 and 6 in FIG. 2A). Third, external requests to blocks that are dirty in L2 cache 103 may also be unaffected (operations 7, 8, 9, and 10 in FIG. 2B may be unchanged compared to operations 7, 8, 9, and 10 in FIG. 2A). One reason is that the valid value of a block resides in L2 cache 103, not in L3 cache 110. Hence, not refreshing the stale block value in L3 cache 110 may not reduce performance.

A possible impact on performance by the embodiment described above may occur when an external request is made for data blocks that are clean in L3 cache 110, such as block A. According to the cache policy illustrated in FIG. 2B, L3 cache 110 may request the data block from L2 cache 103 (operation 3b) which then supplies the block (operations 4a and 4b). This scenario may not affect overall performance significantly for several reasons. First, external requests may be much less frequent than requests by the local processor core (core 101), and so the impact on performance may be secondary. Second, external request latency may already be high in such a scenario (remote L2 cache miss latency+ remote L3 cache miss latency+network latency+local L3 snoop latency), and so adding up to a few tens of cycles to get the block A from L2 cache 103 locally may not add significant latency relative to these other latencies. Third, L3 cache 110 may not be the preferred supplier of the data block in such a scenario, especially for requests from a core on a separate die; the data block may be supplied by main memory as cheaply as from the local L3 cache (L3 cache 110). In some systems, clean blocks may be sourced by the main memory, in which case there may be no penalty introduced by the cache policy described above. Thus, the overall impact of such a cache policy (in which blocks A and C are not refreshed) on performance may be very small.

One issue is that L3 cache 110 may generally need to know exactly what data blocks are cached in L2 cache 103. In some implementations, such state information may not typically be available to L3 cache 110, since a clean block in L2 cache 103 may be evicted "silently," and therefore without notifying L3 cache 110. This may be problematic, because not having the block in L2 cache 103 may cause future L2 cache misses, and not having a refreshed block in L3 cache 110 may result in an L3 cache miss also occurring. Therefore, in some embodiments, a data block replaced from L2 cache 103 may be written back into L3 cache 110, even when the block is clean. In such embodiments, when the block is written back to L3 cache 110, the block refresh may be turned on. It is noted that while writing clean blocks back to L3 cache 110 may consume a higher bandwidth between L2 cache 103 and L3 cache 110, there may be a substantially equivalent amount of reduced bandwidth use when blocks missed by L2 cache 103 bypass L3 cache 110.

A possible refresh energy saving for the above-described cache policy for L3 cache 110 may be equal to the ratio of the size of L2 cache 103 to that of L3 cache 110. This may be because the number of blocks in L3 cache 110 that are not refreshed may be equal to the number of blocks cached in L2 cache 103. For example, if L2 cache 103 is 512 KB while L3 cache 110 is 2 MB, then the refresh energy reduction at L3 cache 110 may be about 25%. If L2 cache 103 is 256 KB and L3 cache 110 is 8 MB, then the refresh energy reduction at L3 cache 110 may be about 3.1%. Thus, the reduction in refresh energy may strongly depend on the ratio of L2 to L3 cache capacity.

In some embodiments, a more complex cache policy may be used to reduce refresh energy more than the cache policy described above. Such a cache policy may exploit the fact that retention time may not be uniform across blocks, since manufacturing variation may result in variation in threshold voltage, which in turn may lead to significant variation in retention time of different memory cells. Generally, retention time in DRAM may be distributed in a log-normal fashion, so that the higher the refresh interval, the higher the probability that some (leaky) cells may fail to work correctly. The probability of a particular DRAM cell failure may increase quickly as a function of refresh interval, since DRAM cells may fail when the refresh interval is larger than the retention time thereof, and retention time has been found empirically to follow a lognormal distribution. Thus, memory blocks in a DRAM cache may each have different of retention times. If a single refresh interval is used for the entire cache, the refresh interval may be chosen based on the retention time of the leakiest block. However, according embodiments of the disclosure, when the leakiest blocks are "mapped out" (that is, not used to store data), the refresh interval can be significantly increased. If the data blocks that are not refreshed in DRAM cache are mapped to the leakiest memory blocks in DRAM cache, then one embodiment can choose a refresh interval based on the remaining memory blocks that are less leaky.

In a set-associative cache, an arbitrary data block may not by definition be mapped into the leakiest memory block in the cache. Instead, in a set-associative cache, a data block can be mapped to one of X blocks in a set, where X is the set associativity. Thus, a data block can be mapped within a set. In addition, the granularity of a refresh operation may not be a cache block, but instead a DRAM row, typically having a size on the order of 1 KB to 4 KB. Thus, a DRAM row may hold one or multiple cache blocks and, in some instance, a DRAM cache may be designed so that a DRAM row contains one or more cache sets. For ease of discussion below, a DRAM row is assumed to contain exactly one cache set, although the applicability of techniques described herein is not limited to such a granularity for refresh operations, and DRAM rows containing more than one cache set may benefit from cache policies described herein.

FIG. 3A illustrates an example of a cache organization 300 for a particular cache set of a DRAM cache, in accordance with at least some embodiments of the present disclosure. In cache organization 300, the leakiest memory block in a four-way associative cache set may be profiled and recorded using a set of tables: leakiness rank table 310 and a refresh interval table 320. Cache organization 300 may also include a cache tag array 330 and a cache data array 340. Cache tag array 330 may be implemented in SRAM or DRAM and may be configured to track the locations of data blocks currently stored or loaded in the cache set (e.g., which memory blocks store which data blocks). Cache data array 340 may be implemented in DRAM, and may include multiple memory blocks or "cache lines," (in this example four, since a four-way associative cache is described) that can each store a data block associated with the cache set. In cache organization 300, the cache set illustrated may include four ways, with a memory block in each way of the cache, although in other embodiments, each set of the cache may have more or less than four ways. Furthermore, it is assumed that the information of retention time per memory block in the cache set is available, and that refresh interval may be applied on a per-set basis. Thus, in the embodiment illustrated in FIG. 3A, the four memory blocks of the cache set associated with cache organization 300 may generally all be refreshed with the same refresh interval.

Leakiness rank table 310 may record the ranking of memory blocks in a set (e.g., cache lines CL1, CL2, CL3, and CL4) based on leakiness. For example, FIG. 3A illustrates that for the cache set shown, the fourth block in the set (CL4) is leakiest (rank 1), the second block (CL2) is less leaky (rank 2), the third block (CL3) is still less leaky (rank 3), and the first block (CL1) is the least leaky (rank 4), hence the rankings from left to right are: CL4-CL2-CL3-CL1. Refresh interval table 320 may indicate what the refresh interval for the entire set should be when the block being indexed is excluded from refresh. For example, when the default refresh interval is 64 ms, all blocks may be assumed to be refreshed. When the only the leakiest block is not refreshed, refresh interval table 320 shows the refresh interval may be 128 ms. When the second and third leakiest (and also the leakiest) blocks are not refreshed, the refresh interval may increase to 256 ms. Finally, when all four blocks are not refreshed, the refresh interval may increase to infinite ("inf" on refresh interval table 320). In FIG. 3A, a current refresh index 350, which may indicate how many cache ways of the cache set associated with cache organization 300 are not being refreshed, may have a value of "0." Thus, all cache ways (each with one memory block) may be refreshed, using the default 64 ms refresh interval for the cache set.

An operational example is now described with respect to cache organization 300 and the four-way associative cache set associated therewith. As shown in FIG. 3A, data blocks Z and Y may be stored in cache lines CL2 and CL4, respectively. Data block Z in line CL2 may be assumed to be the least recently used (LRU) data block when an L3 cache miss to data block X occurs (operation 301). The LRU block is Z, and so data block Z may be selected for eviction. However, cache line CL2, in which data block Z is stored, may not be the leakiest cache way; cache line CL4 may be the leakiest cache way, but currently cache line CL4 stores block Y. Consequently, to load the incoming data block X (fetched from main memory) in the leakiest cache line while evicting the LRU block (data block Z), an additional operation may be performed. After block Z is evicted from both cache tag array 330 and from cache data array 340, (operations 302a and 302b), data block Y may be moved from cache line CL4 to cache line CL2 in both cache tag array 330 and from cache data array 340 (operations 303a and 303b). Data block X may then be fetched from main memory, and may be placed in cache tag array 330 (operation 304), satisfying the inclusion property of the L3 DRAM cache, while the actual data of data block X may be passed directly to a cache line of the L2 cache (operation 305). Thus, because data block X is kept in the L2 cache, the cache way indicated in cache tag array 330 as storing the data of data block X (in this case cache line CL4) may not need to be refreshed in the L3 cache, and cache line CL4 can be excluded from refresh and allowed to discharge.

Exclusion of cache line CL4 from refresh may be achieved by the following operations: current refresh index 350 may be incremented by 1 (operation 306), the value in the current refresh index 350 may be used to select an appropriate entry of the cache set in leakiness rank table 310 (operation 307), and the selected entry in leakiness rank table 310 may be used to select the refresh interval in refresh interval table 320 (operation 308) that results in the exclusion from refresh by the targeted number of cache ways (indicated by current refresh index 350).

FIG. 3B illustrates the outcome of an operational example in the cache organization illustrated in FIG. 3A, and more particularly, FIG. 3B illustrates the outcome of operations 301-308 in cache organization 300. As shown, by increasing the refresh interval from the default 64 ms to 128 ms, cache line CL4 may no longer be refreshed, and is depicted as a black rectangle. It is noted that moving data block Y, as described above in conjunction with operations 303a and 303b, may not be necessary in all situations. For example, when the leakiest cache line happens to be the cache line that stores the data block that is a candidate for eviction, the data block that is a candidate for eviction may not be moved.

Thus, as demonstrated in FIGS. 3A and 3B, an L3 cache miss may have the potential to increase refresh interval and therefore reduce refresh energy. According to some embodiments, in some situations refresh interval may be decreased. For example, when a data block is evicted from the L2 cache, the data block may be written back into the L3 cache—a procedure according to some cache policies. Writing back a data block to L3 DRAM cache may involve a cache line being activated, and therefore refreshed again. FIGS. 4A and 4B illustrate such a process with respect to cache organization 300 illustrated in FIGS. 3A and 3B and the four-way associative cache set associated therewith, according to at least some embodiments of the present disclosure. In the scenario illustrated in FIGS. 4A and 4B, two data blocks (U and V) may be currently cached in L2 cache, and hence may occupy cache tag array 330, while the corresponding cache lines in cache data array 340 may not be refreshed (depicted as black rectangles), and therefore may not store the data associated with data blocks U and V.

In FIG. 4A, a data block U may be written back from the L2 cache (operation 401), and a storage location for data block U may then be selected (e.g., one of cache lines CL1, CL2, CL3, or CL4). To make such a selection, cache tag array 330 may first be checked to determine which of cache lines CL1-CL4 is currently the placeholder for data block U (operation 402). In one embodiment (operation 410), data block U may then be written to the cache line that is the current placeholder for block U (in FIG. 4A, this is cache line CL4). In another embodiment, a more energy efficient procedure may be to choose the least leaky cache line among the cache lines that are currently not active/refreshed (in FIG. 4A, this may involve choosing between cache lines CL2 and CL4).

To achieve this more energy efficient procedure, the least leaky cache line may be determined by first looking up the current refresh index 350 (operation 403). In FIG. 4A, the current refresh index 350 may have a value of "2," which indicates that there may be two lines that are not refreshed in the cache set associated with cache organization 300. Next, the current refresh index 350 may be compared against leakiness rank table 310 (operation 404), indicating that cache line CL2 may be the least leaky cache line that is currently not refreshed. Since cache line CL2 may be the least leaky cache line that is currently not refreshed, cache line CL2 may be selected as the new placeholder for data block U (operation 405). Since cache line CL2 is already a placeholder for data block V while cache line CL4 is a placeholder for data block U, a tag swap may be initiated (operations 406a and 406b), so that data block U can be placed in cache line CL2. It is noted that such a tag swap operation may not be necessary if the current placeholder cache line for the data block being written back happens to already be the least leaky non-active cache line. After operations 406a and 406b, the current refresh index 350 may be decremented while the refresh interval may be updated by consulting refresh interval table 320. The final state of cache organization 300 is shown in FIG. 4B: data block U is stored in cache line CL2, the least leaky of cache lines CL2 and CL4, and data block V may not be stored in cache data array 340 but may still be referenced in cache tag array 330.

It is noted that cache organization 300, as described herein, may be erroneously interpreted as behaving like an exclusive cache, where a data block newly brought into cache bypasses the L3 cache, is instead placed directly in the L2 cache, and is only placed in the L3 cache upon L2 block eviction. However, techniques and cache policies described herein differ from an exclusive cache in at least one way: the L3 cache tags (e.g., cache tag array 330) may be inclusive of L2 cache tags, and therefore the benefit of address filtering in an inclusive L3 cache still remains. Only the data array portion (cache tag array 330) of certain data blocks associated with L3 cache may be interpreted as behaving similar to an exclusive cache.

Figure 5:
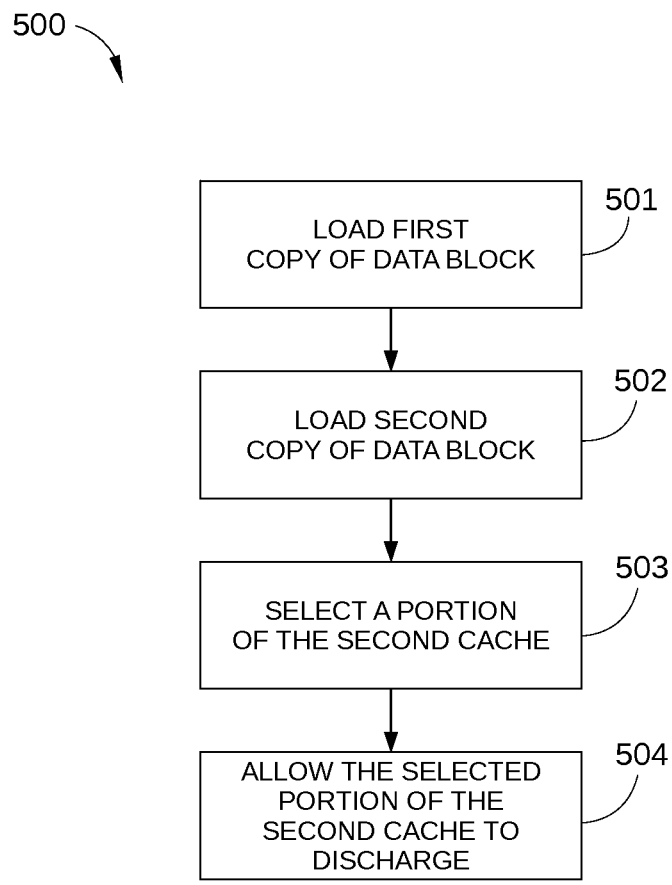
FIG. 5 sets forth a flowchart of an example method to cache a data block for a processor, according to an embodiment of the disclosure.

FIG. 5 sets forth a flowchart of an example method 500 to cache a data block for a processor, according to an embodiment of the disclosure. Method 500 may include one or more operations, functions, or actions as illustrated by one or more of blocks 501-504. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided. Although method 500 is described in conjunction with multicore architecture 100 of FIG. 1, any suitable computing device configured to perform method 500 is within the scope of this disclosure. While described below as performed by a cache controller associated with multicore architecture 100, such as memory controller 918 in FIG. 9, control algorithms for method 500 may reside in and/or be performed by any other suitably configured software, firmware, or logic circuit entity.

Method 500 may begin in block 501 ("Load first copy of data block"), in which a cache controller may load a first copy of a data block in a first cache that includes a first volatile memory device configured to retain data without being refreshed. For example, a data block may be loaded in L2 cache 103, which may be SRAM-based cache.

In block 502 ("Load a second copy of data block"), the cache controller may load a second copy of the data block in a second cache that includes a second volatile memory device configured to lose data when not refreshed. For example, a second copy of the data block may be loaded in L3 cache 110, which may be DRAM-based cache. It is noted that both the first copy and the second copy of the data block may be up-to-date versions of the data block, and therefore may include identical data.

In block 503 ("Select a portion of the second cache"), the cache controller may select a portion of the second cache, where the selected portion of the second cache may include one of an invalid data block or the second copy of the data block. The selected portion therefore may be selected in block 503 because the portion may store a data block that can be allowed to discharge since data stored therein are already stored in another level of cache. The portion of the second cache may be, for example, a cache line or a cache way of L3 cache 110. In some embodiments, the cache controller may also store state information associated with the selected portion of the second cache, the state information indicating that the first copy of the data block is loaded in the first cache.

In block 504 ("Allow the selected portion of the second cache to discharge"), concurrent with or after loading the first copy of the data block in block 501, the cache controller may allow the selected portion of the second cache to discharge, so that no data is stored in the selected portion.

In the above-described embodiments, increasing refresh intervals provides an attractive alternative to achieving dynamic DRAM cache-sizing, where leakier cache lines are not used to store data when refresh interval of a higher-level DRAM cache is increased. In some embodiments, these leakier cache lines may be employed to temporarily store data blocks even though these cache lines are not refreshed and/or have a retention time that is less than the current refresh interval. Specifically, these cache lines may have the capability of retaining data until the retention time has expired. Data can be retrieved correctly before the retention time has expired and these cache lines may be sufficiently usable in such a case. Thus, such cache lines in a DRAM-based cache can be useful, despite having relatively short retention times. In comparison, cache lines in cache ways that have been power-gated may be completely unusable. Two cache policies utilizing leaky cache lines opportunistically in order to improve performance are described herein: "leaky victim policy" and "leaky nursery policy."

Figure 6A:
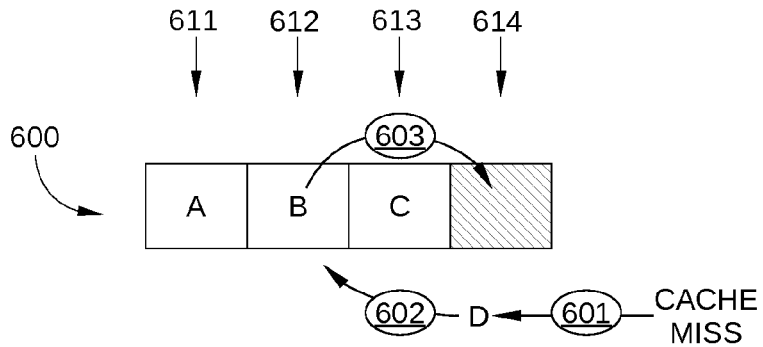
FIGS. 6A, 6B, and 6C illustrate a leaky victim policy implemented in an L3 cache set that includes four cache lines, one of which is a leaky cache line.
Figure 6B:
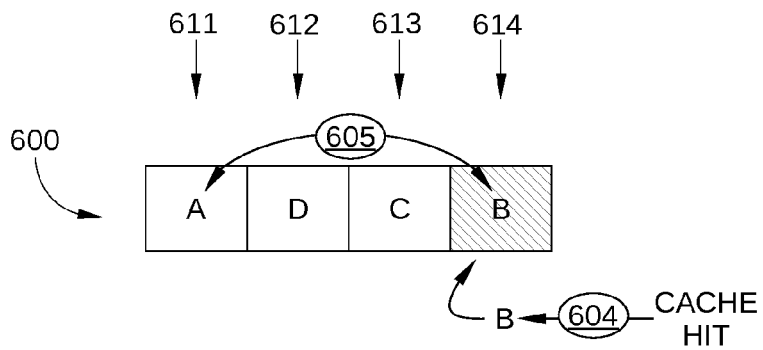
Figure 6C:
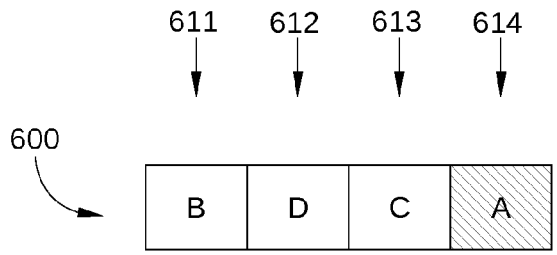

According to the leaky victim policy, cache lines can be used opportunistically to hold victim data blocks. Specifically, a data block from a non-leaky cache line that is evicted during operation may be placed in a leaky line, which may be a cache line whose retention time is equal to or smaller than the current refresh interval. If the data block is accessed again before the leaky line fails to retain data, the data block can still be found in the cache (in the leaky line), thereby avoiding a cache miss. FIGS. 6A, 6B, and 6C illustrate the leaky victim policy implemented in an L3 cache set 600 that includes four cache lines 611-614, one of which is a leaky cache line. In addition, cache set 600 contains three data blocks: A, B, and C, as shown, where data block B, being the LRU block in cache set 600, may be the victim candidate. In the embodiment illustrated in FIGS. 6A, 6B, and 6C, cache line 614 may be a leaky cache line that therefore may have a retention time that is less than the current fresh interval for cache set 600.

In FIG. 6A, an access to data block D, which is not contained in cache, may result in a cache miss (operation 601). When the cache miss is satisfied (for example, by fetching block D from main memory), data block D may then be brought into cache, specifically, into cache set 600 (operation 602). The victim block (data block B) may then be selected for eviction to make room for data block D (operation 603). However, according to embodiments in which the leaky victim policy is implemented, rather than evicting data block B, data block B may be moved to the leaky cache line in cache set 600 (cache line 614).

In FIG. 6B, which illustrates cache set 600 after operation 603 is completed, an access to data block B (operation 604) may occur within the retention time of the leaky cache line (cache line 614). This access may result in a cache hit, because data block B may still be contained in cache set 600; according to leaky victim policy, data block B was moved to cache line 614 rather than being evicted. Alternatively, an access to data block B may result in a cache miss if such an access does not occur within the retention time of cache line 614. When data block B is accessed and hit, data block B may be swapped with the next victim block, which in FIG. 6B is block A (operation 605). FIG. 6C shows the final content of cache set 600, where data blocks B, C, and D are in non-leaky cache lines (cache lines 611, 613, and 612, respectively), and data block A is contained in the leaky cache line (cache line 614) of cache set 600.

Many data blocks may not be reused once brought into the last level cache (e.g., L3 cache), since these data blocks may have temporal and spatial locality that may be captured entirely by the L2 cache. Thus, accesses to such data blocks may appear as L2 cache hits rather than L3 cache hits, giving an appearance that there is no reuse at the L3 cache level. The larger the L3 cache is, the larger number of blocks that may exhibit such behavior. Such behavior may be exploited in various ways, such as selectively bypassing the L3 cache altogether ("cache bypassing"), or by inserting blocks at the LRU line instead of at the most-recently-used (MRU) line, and only promoting a data block to the MRU line upon an access to the data block ("LRU cache insertion").

Figure 7A:
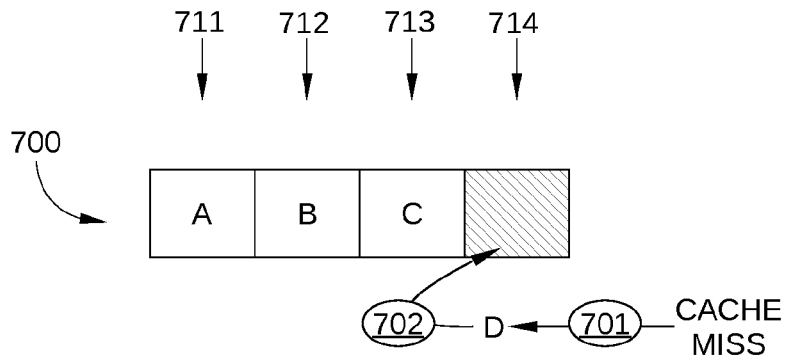
FIGS. 7A, 7B, and 7C illustrate a leaky nursery policy implemented in an L3 cache set that includes four cache lines, one of which is a leaky cache line.
Figure 7B:
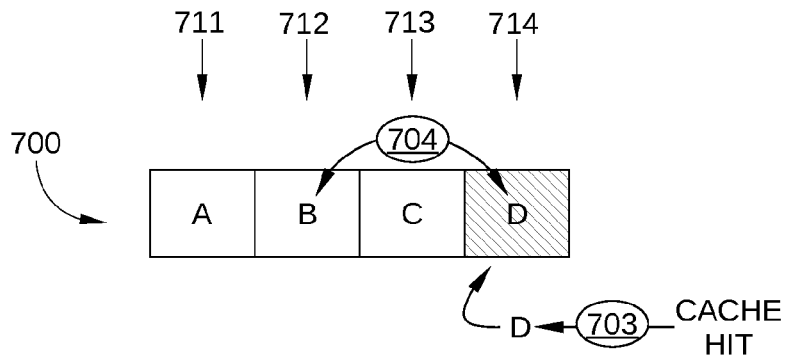
Figure 7C:
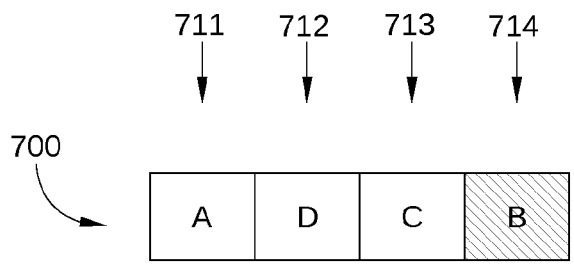

According to the leaky nursery policy, a newly fetched data block may be placed in a leaky cache line. If the data block is accessed within the retention time of the leaky cache line, a cache hit may result. However, if the data block is not accessed within the retention time of the leaky cache line, then the access may result in a cache miss. Generally, data blocks that are truly exhibiting reuse at the L3 cache level may be reused soon after being placed in the L3 cache. FIGS. 7A, 7B, and 7C illustrate a leaky nursery policy implemented in an L3 cache set that includes four cache lines, one of which is a leaky cache line. More particularly, FIGS. 7A, 7B, and 7C illustrate the leaky nursery policy implemented in an L3 cache set 700 that includes four cache lines 711-714, where cache line 714 may be a leaky cache line that therefore may have a retention time that is less than the current fresh interval for cache set 600. In addition, cache set 700 may contain three data blocks: A, B, and C, as shown.

In FIG. 7A, an access to data block D, which is not contained in cache, may result in a cache miss (operation 701). The cache miss may be satisfied (for example, by fetching block D from main memory), and data block D may then be brought into cache set 700. However, according to embodiments in which the leaky nursery policy is implemented, the LRU data block of cache set 700 may not be evicted to make room for the data block just brought into cache set 700 (data block D). Instead, the LRU data block of cache set 700 may remain in place and data block D may be stored (operation 702) in the leaky cache line of cache set 700 (cache line 714). This result is illustrated in FIG. 7B. If there is an access to data block D within the retention time of cache line 714, there may be a cache hit (operation 703). Since at this time block D has proven to exhibit reuse at the L3 cache level, data block D may be promoted in the LRU stack. For instance, data block D may be swapped with another data block contained in cache set 700 (operation 704). In some embodiments, the data block that is swapped with data block D may be the LRU block of cache set 700. In other embodiments, a random data block may be swapped with data block D to prevent the data block being swapped with data block D from being evicted too soon. In such embodiments, the random data block swapped with data block D may be a random non-MRU, non-LRU data block. FIG. 7B illustrates data block B as the data block swapped with data block D as a result of data block D being accessed from cache line 714. FIG. 7C shows the final content of cache set 700, where data blocks A, D, and C are in non-leaky cache lines (cache lines 711, 712, and 713, respectively), and data block B is contained in the leaky cache line (cache line 714) of cache set 700.

The leaky nursery policy is usable for workloads that have difficult to predict access patterns. Each cache in many processors may have a hardware engine that performs prefetching, which attempts to anticipate the next data blocks that will be accessed and prefetch such data block early into the cache. However, the probability of prefetched blocks being used may not be very high, and it would be useful if such prefetched blocks can be placed in the cache without consuming additional refresh energy in the DRAM cache. The leaky nursery policy provides such an opportunity.

Note that the leaky victim and leaky nursery policies are not conflicting policies, and both can be applied simultaneously in some embodiments. When applied simultaneously, these two cache policies may produce a synergy. For example, when there is more than one leaky cache line in a set, leaky cache lines may be ranked based on retention time, and may then be utilized according to a prioritization scheme. For example, the reuse frequency of each block in a set may be profiled, and the reuse interval may be matched with the retention time of a block accordingly. If reuse interval can be maintained lower than retention time, then leaky lines may retain data as if they were not leaky.

It is noted that the ability to detect any number of bit errors in each cache line may facilitate implementation of the leaky victim and leaky nursery policies described herein. An error due to not refreshing a block in time can only flip a bit value "1" to "0" (lack of capacitor charge), but not from "0" to "1". Therefore, any number of bit errors can be detected by simply counting the number of 1's in the original correct data. This is referred to as Berger's code, which has a complexity of lg(BlockSize). So, for example, if a block has 64 bytes (512 bits), 9 bits of error detection code may be used to track an error. If the block size is 1 KB for example, 13 bits of error detection code may be used to track an error. If the block size is 4 KB for example, 15 bits of error detection code may be used to track an error. Thus, the overhead for error detection may be low and acceptable, at 1.7%, 0.15%, and 0.04% for 64-byte, 1 KB, and 4 KB block sizes, respectively, for example. Since an L3 DRAM cache may be likely to have large rather than small block sizes (a L3 cache block size may be 512 bytes, for example), the error detection overhead may be miniscule.

Figure 8:
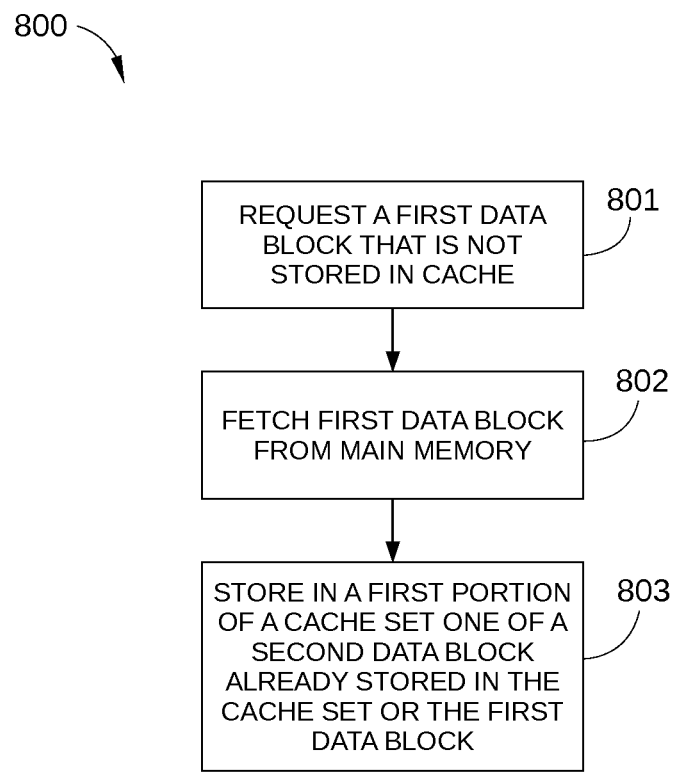
FIG. 8 sets forth a flowchart of an example method to store a data block in a cache set of a volatile memory device that loses data when not refreshed and is configured as a cache for a processor, according to an embodiment of the disclosure.

FIG. 8 sets forth a flowchart of an example method 800 to store a data block in a cache set of a volatile memory device that loses data when not refreshed and is configured as a cache for a processor, according to an embodiment of the disclosure. Method 800 may include one or more operations, functions, or actions as illustrated by one or more of blocks 801-804. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided. Although method 800 is described in conjunction with multicore architecture 100 of FIG. 1, any suitable computing device configured to perform method 800 is within the scope of this disclosure. While described below as performed by a processor associated with multicore architecture 100, control algorithms for method 800 may reside in and/or be performed by any other suitably configured software, firmware, or logic circuit entity.

Method 800 may begin in block 801 ("Request a first data block that is not stored in cache"), in which core 101 may request a first data block that is not stored in a cache associated with core 101. For example, the first data block may not reside in L1 cache 102, L2 cache 103, or L3 cache 110. Consequently, the request for the first data block may be transmitted to a main memory associated with core 101.

In block 802 ("Fetch the first data block from main memory"), core 101 may fetch the first data block from a main memory associated with the processor.

In block 803 ("Store in a first portion of a cache set one of a second data block already stored in the cache set or the first data block"), core 101 may store either the first data block or a second data block in a cache set of a volatile memory device that loses data when not refreshed and is configured as a cache for core 101 (e.g., L3 cache 110). The second data block may be a data block that is already stored in the cache set. The first portion of the cache set may be a so-called "leaky" cache line of the cache set, having a retention time that may be equal to or greater than a refresh interval of the cache set at the time the data block is fetched from the main memory. In some embodiments, the first portion may be the leakiest cache line of the cache set.

In some embodiments, in block 803 the second data block may be moved from a second portion of the cache set to the first portion (which is the leaky cache line), and the first data block may then be stored in the second portion. This is the leaky victim policy. In other embodiments, the first data block may be stored in the first portion of the cache set and none of the data blocks currently residing in the cache set may be relocated. This is the leaky nursery policy.

According to embodiments described herein, leaky cache lines may be opportunistically used for storing either victim data blocks (leaky victim policy) or newly fetched data blocks (leaky nursery policy). If the data blocks that are placed in leaky lines are accessed within the retention time of the leaky lines, the lines may provide correct functionality, and additional effective cache capacity may be gained without paying the penalty of consuming higher refresh energy. When the data blocks are not accessed again within the retention time of the leaky lines, correct values may possibly be lost in data blocks stored in this way.

Figure 9:
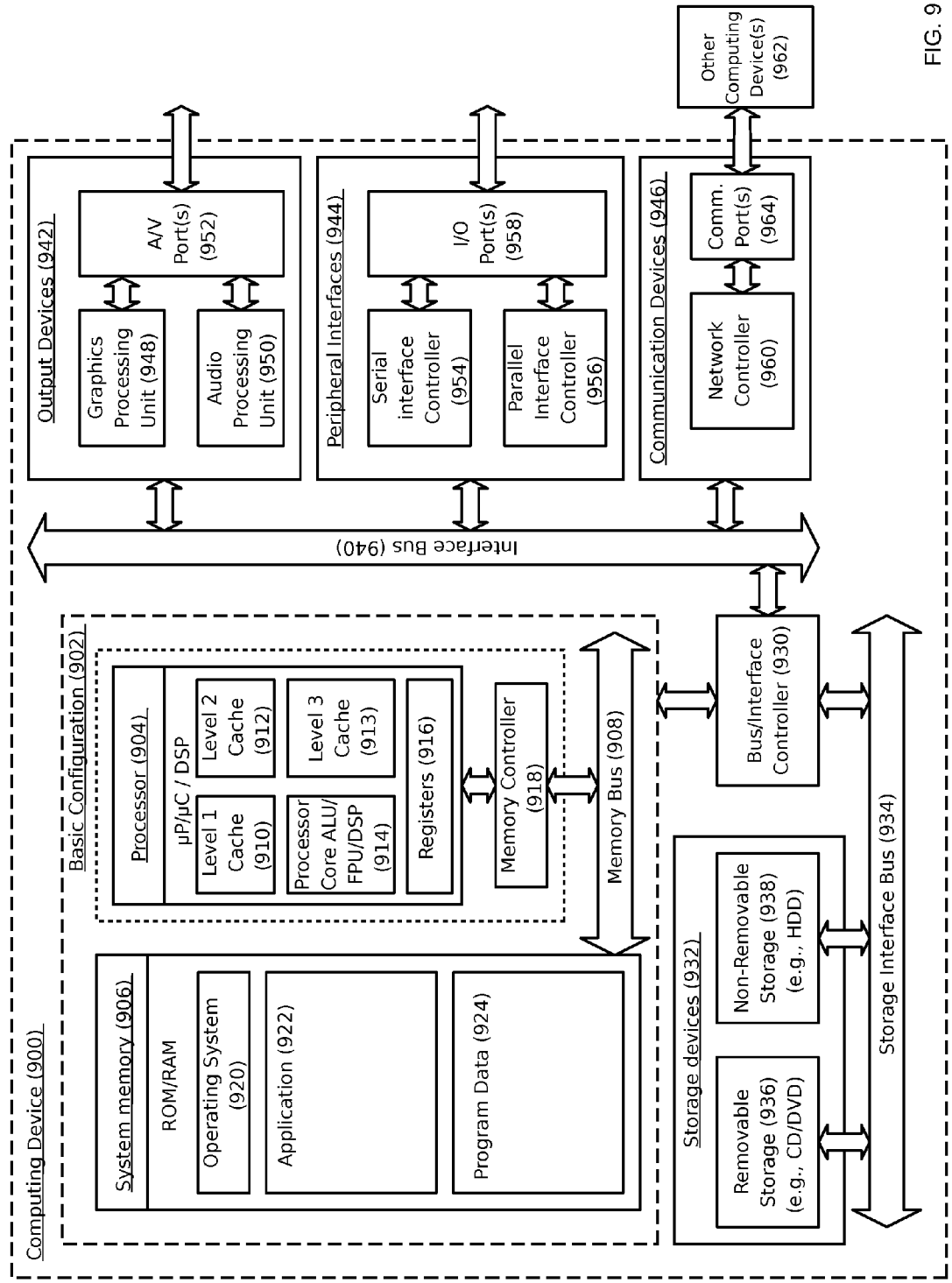
FIG. 9 is a block diagram illustrating an example computing device, according to at least some embodiments of the present disclosure.

FIG. 9 is a block diagram illustrating an example computing device 900, according to at least some embodiments of the present disclosure. In some embodiments, computing device 900 may be used to implement multicore architecture 100 of FIG. 1. In a very basic configuration 902, computing device 900 typically includes one or more chip multiprocessors 904 and a system memory 906. A memory bus 908 may be used for communicating between processor 904 and system memory 906.

Chip multiprocessor 904 may be substantially similar in configuration and operation to multicore architecture 100 in FIG. 1. Depending on the desired configuration, chip multiprocessor 904 may be of any type including but not limited to a microprocessor (µP), a microcontroller (µC), a digital signal processor (DSP), or any combination thereof. Processor 904 may include one more levels of caching, such as a level one cache 910, a level two cache 912, and a level three cache 913, as well as a processor core 914 and registers 916. Level one cache 910 may be used to implement L1 instruction and data cache 102 in FIG. 1, level two cache 912 may be used to implement L2 cache 103 in FIG. 1, and level three cache 913 may be used to implement L3 data cache 110 in FIG. 1. An example processor core 914 may include an arithmetic logic unit (ALU), a floating point unit (FPU), a digital signal processing core (DSP Core), or any combination thereof. An example memory controller 918 may also be used with processor 904, or in some implementations memory controller 918 may be an internal part of processor 904. In some embodiments, memory controller may act as or include a cache controller.

Depending on the desired configuration, system memory 906 may be of any type including but not limited to volatile memory (such as RAM), non-volatile memory (such as ROM, flash memory, etc.) or any combination thereof. System memory 906 may include an operating system 920, one or more applications 922, and program data 924. In some embodiments, application 922 may be arranged to operate with program data 924 on operating system 920. This described basic configuration 902 is illustrated in FIG. 9 by those components within the inner dashed line.

Computing device 900 may have additional features or functionality, and additional interfaces to facilitate communications between basic configuration 902 and any required devices and interfaces. For example, a bus/interface controller 930 may be used to facilitate communications between basic configuration 902 and one or more data storage devices 932 via a storage interface bus 934. Data storage devices 932 may be removable storage devices 936, non-removable storage devices 938, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 906, removable storage devices 936 and non-removable storage devices 938 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 900. Any such computer storage media may be part of computing device 900.

Computing device 900 may also include an interface bus 940 for facilitating communication from various interface devices (e.g., output devices 942, peripheral interfaces 944, and communication devices 946) to basic configuration 902 via bus/interface controller 930. Example output devices 942 include a graphics processing unit 948 and an audio processing unit 950, which may be configured to communicate to various external devices such as a display or speakers via one or more A/V ports 952. Example peripheral interfaces 944 include a serial interface controller 954 or a parallel interface controller 956, which may be configured to communicate with external devices such as input devices (e.g., keyboard, mouse, pen, voice input device, touch input device, etc.) or other peripheral devices (e.g., printer, scanner, etc.) via one or more I/O ports 958. An example communication device 946 includes a network controller 960, which may be arranged to facilitate communications with one or more other computing devices 962 over a network communication link, such as, without limitation, optical fiber, Long Term Evolution (LTE), 3G, WiMax, via one or more communication ports 964.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

As described herein, embodiments of the present disclosure enable reduced DRAM refresh energy in a DRAM cache by avoiding refresh of some types of memory blocks therein. For example, memory blocks storing invalid data or data blocks that are also stored in L2 cache may not be refreshed. In some embodiments, DRAM refresh energy may be reduced by arranging data blocks that are in a DRAM cache and are not to be refreshed to correspond to the leakiest memory blocks in the DRAM cache. In other embodiments, a per-set refresh interval of one or more cache sets in a DRAM cache may be increased. Thus, refresh energy in a large DRAM last-level cache may be significantly reduced using one or more of the embodiments described herein.

The use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and designing the circuitry and/or writing the code for the software and or firmware are possible in light of this disclosure. In addition, the mechanisms of the subject matter described herein are capable of being distributed as a program product in a variety of forms, and an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. A typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. Such depicted architectures are merely exemplary, and in fact, many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments are possible. The various aspects and embodiments disclosed herein are for purposes of illustration and are not intended to be limiting, with the true scope and spirit being indicated by the following claims.

I claim:

1. A method to cache a data block for a processor disposed on a die, the method comprising:
   loading a first copy of the data block in a first cache that includes a first volatile memory device disposed on the die;
   loading a second copy of the data block in a second cache that includes a second volatile memory device disposed on the die and that is configured to lose data when not refreshed;
   selecting a portion of the second cache, wherein the selected portion of the second cache includes the second copy of the data block;
   responsive to the first copy of the data block being loaded in the first cache, allowing the selected, portion of the second cache to discharge over time so that no data is stored in the selected portion after discharge;
   responsive to the discharge of the selected portion of the second cache, determining a refresh interval based on memory blocks that are present in a remaining portion of the second cache; and
   refreshing the second cache based on the determined refresh interval.

2. The method of claim 1, further comprising storing state information associated with the selected portion of the second cache, wherein the state information indicates that the first copy of the data block is loaded in the first cache.

3. The method of claim 2, further comprising:
   prior to allowing the selected portion of the second cache to discharge, determining that the state information indicates that the first copy of the data block is loaded in the first cache.

4. The method of claim 2, further comprising:
   evicting the first copy of the data block from the first cache; and
   updating the state information to indicate that the first copy of the data block is not loaded in the first cache.

5. The method of claim 1, wherein the second cache is configured to store data associated with another processor.

6. The method of claim 5, wherein the processor and the another processor are disposed on the die.

7. The method of claim 1, wherein selecting the portion of the second cache includes selecting a line of a dynamic random-access memory bank.

8. The method of claim 1, wherein:
   loading the first copy of the data block in the first cache includes loading a data block requested by the processor into a cache line of the first volatile memory device;
   loading the second copy of the data block in the second cache includes loading the data block requested by the processor into a first cache line, included in the selected portion, of the second volatile memory device; and
   the method further comprises:
      updating a cache tag array for the second volatile memory device to indicate that the data block requested by the processor is loaded in the first cache line of the second volatile memory device.

9. The method of claim 8, further comprising:
   prior to loading the data block requested by the processor into the cache line of the first volatile memory device, receiving the data block requested by the processor from a source external to the processor, the first volatile memory device, and the second volatile memory device.

10. The method of claim 9, further comprising:
prior to receiving the data block requested by the processor from the source, determining that the data block requested by the processor is absent in the second volatile memory device.

11. The method of claim 8, further comprising:
prior to updating the cache tag array for the second volatile memory device, evicting a least recently used data block from a second cache line of the second volatile memory device.

12. The method of claim 11, further comprising:
loading a cached block in the second cache line of the second volatile memory device; and
updating the cache tag array for the second volatile memory device to indicate that the cached block is loaded in the second cache line of the second volatile memory device.

13. The method of claim 12, further comprising:
after loading the cached block in the second cache line of the second volatile memory device, refreshing a cache set that includes the first cache line of the second volatile memory device and the second cache line of the second volatile memory device at a refresh interval at which the first cache line of the second volatile memory device is unable to retain data.

14. The method of claim 1, wherein the second volatile memory device comprises an associative cache for the processor.

15. The method of claim 1, wherein the first volatile memory device is configured to retain data stored therein without being refreshed.

16. A processor apparatus, comprising:
a processor disposed on a die;
a first cache that includes a first volatile memory device disposed on the die;
a second cache that includes a second volatile memory device disposed on the die and that is configured to lose data when not refreshed; and
a cache controller coupled to the first cache and the second cache, wherein the cache controller includes circuitry configured to:
load a first copy of a data block in the first cache;
load a second copy of the data block in the second cache;
select a portion of the second cache, wherein the selected portion of the second cache includes the second copy of the data block;
responsive to the first copy of the data block being loaded in the first cache, allow the selected portion of the second cache to discharge over time so, that no data is stored in the selected portion after discharge;
evict the first copy of the data block from the first cache; and
in response to the eviction of the first copy, update state information associated with the first cache to indicate that the first copy of the data block is not loaded in the first cache.

17. The processor apparatus of claim 16, wherein the circuitry included in the cache controller is further configured to store state information associated with the selected portion of the second cache, and wherein the state information associated with the selected portion of the second cache indicates that the first copy of the data block is loaded in the first cache.

18. The processor apparatus of claim 16, wherein the circuitry included in the cache controller is further configured to, prior to the selected portion of the second cache being allowed to discharge, determine that the state information associated with the first cache indicates that the first copy of the data block is loaded in the first cache.

19. A method to store a data block in a cache set of a volatile memory device that is disposed on a same die as a processor, that loses data when not refreshed, and that is configured as a cache for the processor, the method comprising:
requesting a first data block that is not stored in the cache;
fetching the first data block from a main memory associated with the processor; and
storing the first data block in a first portion of the cache set,
wherein the first portion has a retention time that is equal to or greater than a refresh interval of the cache set at a time the data block is fetched from the main memory, and
wherein storing the first data block in the first portion of the cache set comprises moving a second data block that is already stored in the cache set from the first portion of the cache set to a second portion of the cache set, the second portion having the smallest retention time in the cache set such that:
an access to the second data block results in a cache hit when the access occurs within the retention time of the second portion, and the second data block is subsequently moved, to another portion of the cache set, or
the access to the second data block does not occur within the retention time of the second portion, and the second data block is discharged.

20. The method of claim 19, further comprising storing the first data block in the second portion of the cache set.

21. The method of claim 19, wherein the second data block comprises a random data block from the cache set that is neither a most-recently-used data block in the cache set nor a least-recently-used data block in the cache set such that moving the second data block to the second portion prevents the second data block from being prematurely evicted.

22. The method of claim 19, wherein the first portion comprises a cache line.

23. The method of claim 19, further comprising:
prior to fetching the first data block, determining that the first data block is not stored in any cache associated with the processor.

24. A method to cache a data block for a processor disposed on a die, the method comprising:
loading a first copy of the data block in a first cache that includes a first volatile memory device disposed on the die;
loading a second copy of the data block in a second cache that includes a second volatile memory device disposed on the die and that is configured to lose data when not refreshed;
selecting a portion of the second cache, wherein the selected portion of the second cache includes the second copy of the data block;
responsive to the first copy of the data block being loaded in the first cache, allowing the selected portion of the second cache to discharge over time so that no data is stored in the selected portion after discharge;
storing state information for the data block in the second cache, wherein the state information indicates that the first copy of the data block is loaded in the first cache;
receiving, by the second cache from a external source, a read request for the data block;

requesting the first cache for write back of the data block in the second cache, based on the stored state information;

responsive to write back of the data block in the second cache, updating the state information for the data block in the second cache; and providing the data block from the second cache to the external source.

\* \* \* \* \*

UNITED STATES PATENT AND TRADEMARK OFFICE
CERTIFICATE OF CORRECTION

PATENT NO. : 9,990,293 B2  
APPLICATION NO. : 14/457128  
DATED : June 5, 2018  
INVENTOR(S) : Solihin Page 1 of 1

It is certified that error appears in the above-identified patent and that said Letters Patent is hereby corrected as shown below:

In the Claims

Column 20, Line 18, Claim 1 delete "selected, portion" and insert -- selected portion -- therefor.

Column 21, Line 50, Claim 16 delete "so, that" and insert -- so that -- therefor.

Column 22, Line 28, Claim 19 delete "moved, to" and insert -- moved to -- therefor.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*